United States Patent
Tanaka et al.

(10) Patent No.: US 7,301,103 B2
(45) Date of Patent: Nov. 27, 2007

(54) PRINTED-WIRING BOARD, PRINTED-CIRCUIT BOARD AND ELECTRONIC APPARATUS

(75) Inventors: Makoto Tanaka, Oume (JP); Shigenori Miyagawa, Oume (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/352,293

(22) Filed: Feb. 13, 2006

(65) Prior Publication Data

US 2006/0180340 A1   Aug. 17, 2006

(30) Foreign Application Priority Data

Feb. 14, 2005   (JP)   ............... 2005-036577

(51) Int. Cl.
*H05K 1/00*   (2006.01)
(52) U.S. Cl. .............. 174/250; 174/250; 174/256; 174/260; 174/262; 174/266; 361/760; 257/79; 257/503; 257/668; 257/700; 257/784; 29/830; 29/831; 29/840
(58) Field of Classification Search .............. 174/250, 174/256, 260–262, 266; 257/79, 503, 668, 257/673, 700, 779, 784; 361/760; 29/830, 29/831, 840
See application file for complete search history.

(56) References Cited

U.S. PATENT DOCUMENTS

| | | | | |
|---|---|---|---|---|
| 5,220,723 A | * | 6/1993 | Okada | 29/830 |
| 5,815,919 A | * | 10/1998 | Nakanishi et al. | 29/840 |
| 5,886,399 A | * | 3/1999 | Ohsawa et al. | 257/668 |
| 5,891,606 A | * | 4/1999 | Brown | 430/312 |
| 6,239,980 B1 | * | 5/2001 | Fillion et al. | 361/760 |
| 6,455,783 B1 | * | 9/2002 | Tsukada et al. | 174/256 |
| 7,005,750 B2 | * | 2/2006 | Liu | 257/779 |
| 2002/0137245 A1 | * | 9/2002 | Kitamura et al. | 438/22 |
| 2003/0201123 A1 | * | 10/2003 | Kistner | 174/261 |
| 2004/0238825 A1 | * | 12/2004 | Lim et al. | 257/79 |
| 2006/0082001 A1 | * | 4/2006 | Miyagawa | 257/784 |
| 2006/0102700 A1 | * | 5/2006 | Huang et al. | 228/180.21 |

FOREIGN PATENT DOCUMENTS

JP   2004-006538   1/2005

* cited by examiner

*Primary Examiner*—Dean A. Reichard
*Assistant Examiner*—Xiaoliang Chen
(74) *Attorney, Agent, or Firm*—Pillsbury Winthrop Shaw Pittman LLP

(57) ABSTRACT

A printed-wiring board having a multiplayer structure including a plurality of insulating layers and a plurality of conducting layers includes a signal pattern provided in at least one of outermost layers of the conducting layers which includes a plurality of pad portions which are provided in positions opposite to a plurality of signal terminals of a connector component arranged in a predetermined form and perform electrical connection, reinforcing portions which are provided to extend from the pad portions respectively in a lengthwise direction, and land portions to perform the electrical connection to another layer of the conducting layers, and a solder resist provided on the outermost layer of the conducting layers to cover the reinforcing portion and having an opening portion to expose the pad portion.

12 Claims, 11 Drawing Sheets

PRINTED-WIRING BOARD, PRINTED-CIRCUIT BOARD AND ELECTRONIC APPARATUS

CROSS-REFERENCE TO RELATED APPLICATIONS

This application is based upon and claims the benefit of priority from the prior Japanese Patent Applications No. 2005-036577, filed on Feb. 14, 2005; the entire contents of which are incorporated herein by reference.

BACKGROUND

1. Field

The present invention relates to a printed-wiring board. Particularly, it relates to a printed-wiring board having pad portions or land portions for mounting an electronic component.

2. Description of the Related Art

Various kinds of connectors, etc. are mounted on a printed-wiring board built in an electronic apparatus. For example, in an electronic apparatus equipped with a memory connector, an external connection connector, etc., a user makes connection/disconnection of such connectors frequently for use of the electronic apparatus. Accordingly, damage of the connectors or damage of the printed-wiring board may be caused by a factor such as external pressure applied on the connectors on the basis of connection/disconnection of the connectors.

In a connector mounting structure for mounting an external interface connector such as a DC-IN connector on a printed-wiring board, soldering lands for fixing leads of the connector has been heretofore used for fixation of the connector. This connector mounting structure however has low tolerance to twisting stress.

As measures to solve this problem, there have been proposed a connector fixing structure, a printed-wiring board and a connector fixing method which are used in a connector mounting structure for mounting an external interface connector on fixation lands of a printed-wiring board by soldering and in which the problem of the fixation lands peeled by twisting force applied on terminals of the connector is solved in spite of an inexpensive and simple structure without use of any other parts such as fixation fittings (e.g. see JP-A-2004-6538 (p. 6, FIG. 1)).

In the technique of JP-A-2004-6538, through-hole lands are however disposed in end portions of fixation pads of the printed-wiring board to thereby prevent the peeling trouble from being caused by twisting stress. Accordingly, it is not always possible to provide through-hole lands in any printed-wiring board because of limitation in design of the printed-wiring board. In addition, the technique of JP-A-2004-6538 is not always suitable for design of a practical printed-wiring board because the technique cannot be applied to pads in portions using surface-mounted parts such as a memory connector.

Therefore, the present invention is achieved to solve the problem. The invention provides a printed-wiring board in which peeling of pads or lands applied to surface-mounted parts as well as DIP parts can be prevented without necessity of changing the configuration of the background-art printed-wiring board largely.

SUMMARY

According to an aspect of the present invention, a printed-wiring board having a multiplayer structure including a plurality of insulating layers and a plurality of conducting layers includes a signal pattern provided in at least one of outermost layers of the conducting layers which includes a plurality of pad portions which are provided in positions opposite to a plurality of signal terminals of a connector component arranged in a predetermined form and perform electrical connection, reinforcing portions which are provided to extend from the pad portions respectively in a lengthwise direction, and land portions to perform the electrical connection to another layer of the conducting layers, and a solder resist provided on the outermost layer of the conducting layers to cover the reinforcing portion and having an opening portion to expose the pad portion.

According to yet another aspect of the present invention, a printed-wiring board having a multiplayer structure including a plurality of insulating layers and a plurality of conducting layers includes through-holes which are provided respectively in positions opposite to a plurality of signal terminals of a DIP component to be mounted, penetrate the printed-wiring board and have inner walls plated with conductors, a signal pattern provided in an outermost layer of the conducting layers on an opposite side to a side where the DIP component is mounted which includes land portions electrically connected to the through-holes, and reinforcing portions which are provided to extend from the land portions respectively in a predetermined direction, and a solder resist provided on the outermost layer of the conducting layers to cover the reinforcing portions and having an opening portion to expose the land portion.

According to yet another aspect of the present invention, an electronic apparatus includes a housing having a unit to input information, and a printed-circuit board stored inside the housing. The printed-circuit board includes a connector component having a plurality of signal terminals arranged in a predetermined form, and a printed-wiring board formed from a plurality of insulating layers and a plurality of conducting layers. The printed-wiring board includes a signal pattern provided in at least one of outermost layers of the conducting layers which includes a plurality of pad portions which are provided in positions opposite to the plurality of signal terminals of the connector component and perform electrical connection, reinforcing portions which are provided to extend from the pad portions respectively in a lengthwise direction, and land portions to perform the electrical connection to another layer of the conducting layers, and a solder resist provided on the outermost layer of the conducting layer to cover the reinforcing portion and having an opening portion to expose the pad portion.

It is possible to prevent peeling of the pads or lands of the printed-circuit board.

DETAILED DESCRIPTION

FIRST EMBODIMENT

A printed-circuit board according to a first embodiment of the invention will be described below with reference to FIGS. 1 to 4.

Figure 1:
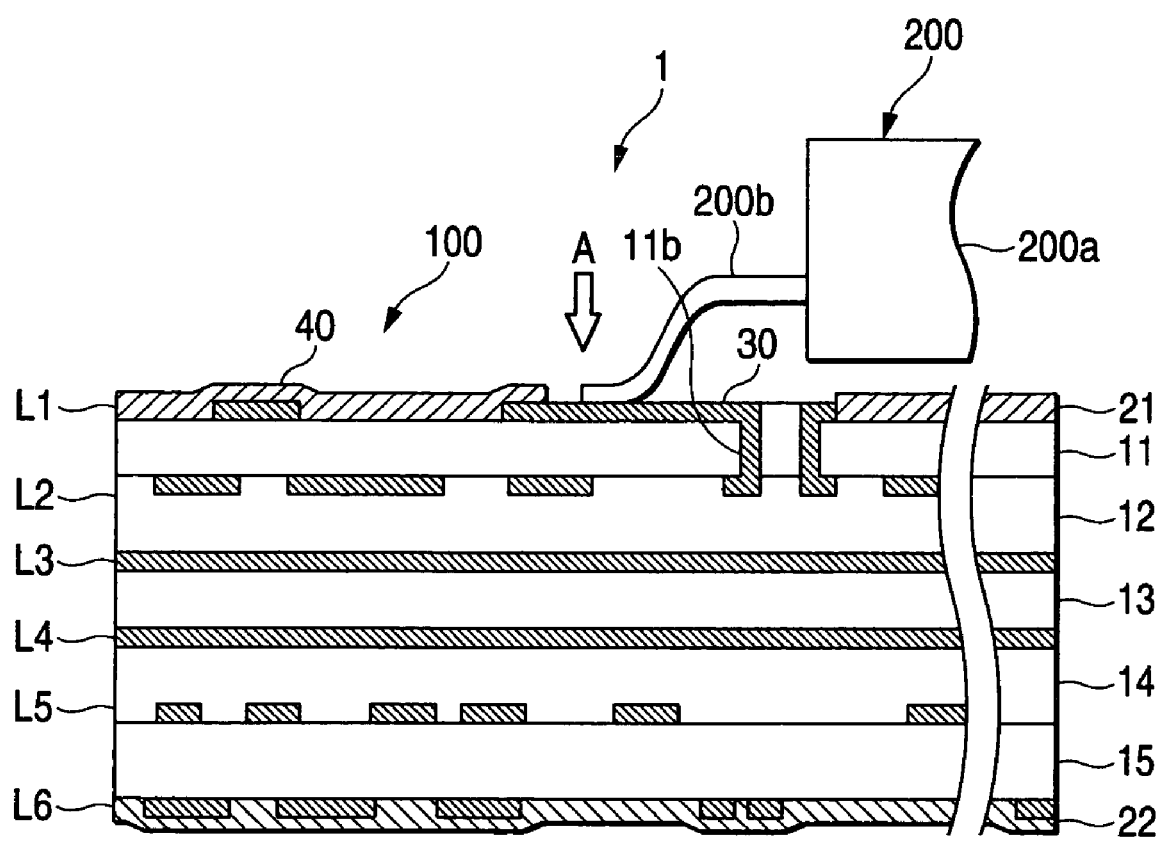
FIG. 1 is a view showing a structure of a printed-circuit board according to a first embodiment of the invention.

FIG. 1 is a view showing the structure of the printed-circuit board according to the first embodiment of the invention.

The printed-circuit board 1 according to the embodiment includes a printed-wiring board 100, and a surface-mounted component 200 mounted on the printed-wiring board.

The printed-wiring board 100 is a multilayer printed-wiring board of an n-layer structure in which conductors and insulators are laminated alternately. In FIG. 1, a six-layer printed-wiring board is shown as the printed-wiring board 100.

That is, there is shown an example of a laminate in which five insulating layers 11, 12, 13, 14 and 15 made of insulators and six conducting layers made of conductors form a six-layer (n=6) structure. In FIG. 1, the six conducting layers are named first layer (L1), second layer (L2), third layer (L3), fourth layer (L4), fifth layer (L5) and sixth layer (L6) in descending order.

In FIG. 1, the third layer (L3) and the fourth layer (L4) among the six layers are formed as plain layers which serve as power supply or ground layers whereas the other layers (the first layer (L1), the second layer (L2), the fifth layer (L5) and the sixth layer (L6)) are formed as signal layers.

Signal patterns 30 and 40 are formed in the first layer (L1) which is one of the signal layers. As will be described later, the signal patterns 30 are provided at least in correspondence with the number of signal terminals 200b of the surface-mounted component 200.

Via holes 11b are provided in the insulating layer 11 formed between the first layer (L1) and the second layer (L2) among the aforementioned layers. The via holes 11b are prepared in such a manner that holes are bored in the insulating layer 11 from the second layer on the inner side toward the first layer on the outer side by means of drilling or the like and plated with conductors respectively. A circuit is formed from the via holes 11b so that the first layer (L1) and the second layer (L2) as the signal layers are connected to each other by the via holes 11b.

Solder resists 21 and 22 are laminated on predetermined regions corresponding to the signal patterns in the first layer (L1) and the sixth layer (L6) which are the outermost signal layers. The solder resists are made of a heat-resistant coating material for preventing solder from being deposited on other portions (e.g. signal patterns) than lands necessary for soldering when the printed-wiring board is soldered. Not only can the solder resists prevent components from being short-circuited but also the solder resists play a role of protecting the conductors because of their insulating characteristic. Incidentally, the lamination of the solder resist 21 will be described later in detail.

On the other hand, the surface-mounted component 200 is a component which has a body 200a, and a plurality of signal terminals 200b and which is mounted on a surface of the first layer (L1) of the printed-wiring board 100 by soldering. That is, one end (one part) of each signal terminal 200b is mounted on a pad portion 33 of a corresponding signal pattern 30 (which will be described later) by soldering (not shown) to thereby electrically connect the surface-mounted component 200 to the printed-wiring board 100. For example, the surface-mounted component 200 may be an SIMM (Single In-Line Memory Module) socket, a DIMM (Dual In-Line Memory Module) socket or a card type module insertion connector called Mini-PCI (Peripheral Component Interconnect) connector.

Figure 2:
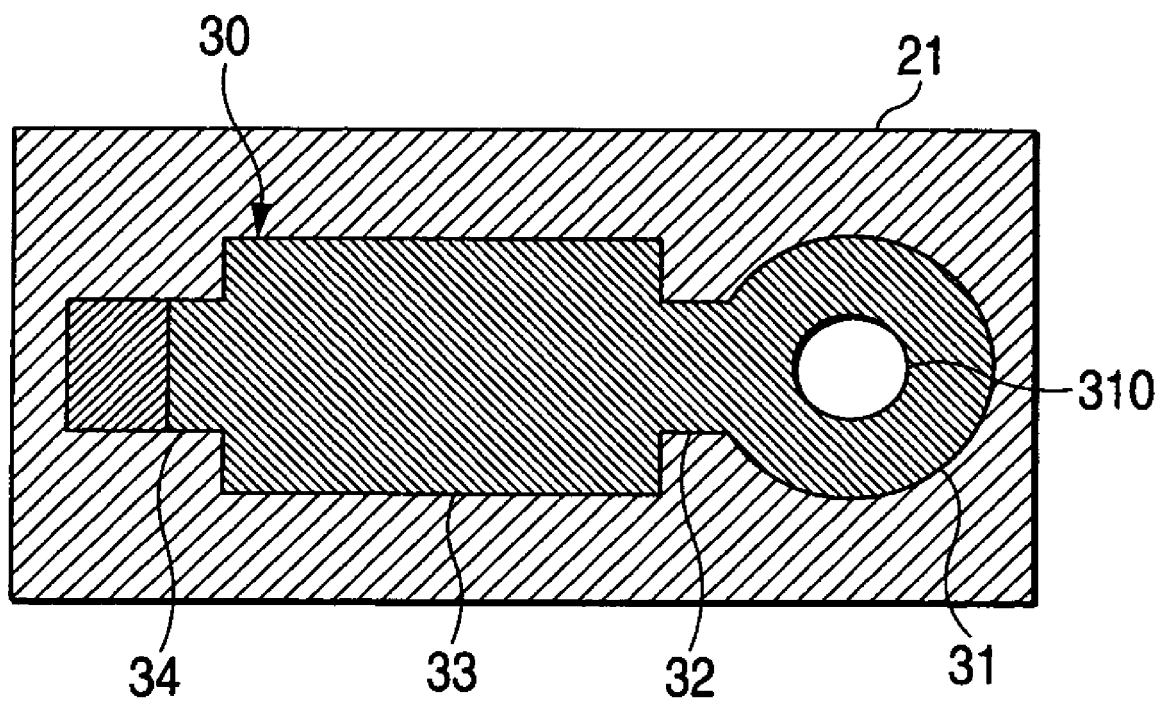
FIG. 2 is a view from a direction A, of the periphery of a signal pattern 30 of a printed-wring board 100 depicted in FIG. 1.

Next, the structure of a signal pattern 30 will be described with reference to FIGS. 1 and 2. FIG. 2 is a view from a direction A, of the periphery of a signal pattern 30 in the printed-wiring board 100 depicted in FIG. 1. Incidentally, although a plurality of signal patterns 30 are provided as described above, only one of the signal patterns 30 is shown in FIG. 2 for the sake of simplification. In order to make understanding easy, a region of a reinforcing portion 34 which is originally invisible and to which the solder resist 21 is laminated is also shown clearly in FIG. 2 (the same rule also applies to FIGS. 4, 6, 8, 9, 11A and 11B).

As shown in FIG. 2, the signal pattern 30 has a land portion 31, a wiring portion 32, a pad portion 33, and a reinforcing portion 34.

Here, the land portion 31 is made of a circular conductor having a hole portion 310 for electrically connecting the first layer (L1) to the second layer (L2) through the via hole 11b.

The wiring portion 32 is made of a conductor for electrically connecting the land portion 31 and the pad portion 33 to each other. As will be described later, the length of the wiring portion 32 varies in accordance with design specifications (see FIGS. 3, 5 and 7).

As described above, the pad portion 33 is made of a conductor for performing electrical connection to a part of the corresponding signal terminal 200b of the surface-mounted component 200. Accordingly, a signal sent from the signal terminal 200b of the surface-mounted component 200 passes through the via hole 11b through the signal pattern 30 and is delivered to the second layer (L2).

The reinforcing portion 34 is made of a conductor which is provided to extend from the pad portion 33. The reinforcing portion 34 plays a role of preventing the pad portion 33 from being peeled. That is, the aforementioned solder resist 21 is laminated on at least a part of the reinforcing portion 34.

Accordingly, as shown in FIG. 2, the solder resist 21 has an opening portion for exposing the land portion 31, the wiring portion 32, the pad portion 33 and a part of the reinforcing portion 34 (if necessary). Alternatively, the solder resist 21 may be configured to have an opening portion for exposing at least the pad portion 33 because the pad portion 33 is used for electrical connection to the surface-mounted component 200 (the same rule also applies to a modification of the first embodiment and another modification of the first embodiment which will be described later).

Although description has been made on the case where the reinforcing portion 34 shown in FIG. 2 is configured to be narrower than the pad portion 33, the invention is not limited thereto. For example, the reinforcing portion 34 may have a width equal to the width of the pad portion 33 or may be wider than the pad portion 33 if allowed on design.

In this manner, the pad portion 33 can be prevented from being peeled because the solder resist 21 is laminated on the reinforcing portion 34 which extends from the pad portion 33 and which is provided as another portion than the pad portion 33 which is a region for performing electrical connection to the signal terminal 200b. That is, in the case of the surface-mounted component 200 such as an SIMM socket or a DIMM socket, a memory is inserted/removed into/from the socket. On this occasion, excessive stress is applied on the surface-mounted component 200, so that this stress is transmitted to the printed-wiring board 100 through the signal terminals 200b.

When the stress applied on the printed-wiring board 100 is bending stress, maximum tensile (or compressive) stress is applied on the outermost layer of the printed-wiring board 100. When the stress applied on the printed-wiring board 100 is normal stress, force may act on the signal pattern 30 to pull up the signal pattern 30 directly. Accordingly, the stress applied on the surface-mounted component 200 is a direct cause of peeling of the pad portion 33 of the signal pattern 30.

Accordingly, when configuration is mad as described above so that the solder resist 21 is laminated on a part of the reinforcing portion 34 which is provided to extend from the pad portion 33, peeling of the pad portion 33 can be prevented finally because the reinforcing portion 34 suppresses peeling force even if stress is applied on the printed-circuit board 1.

Figure 3:
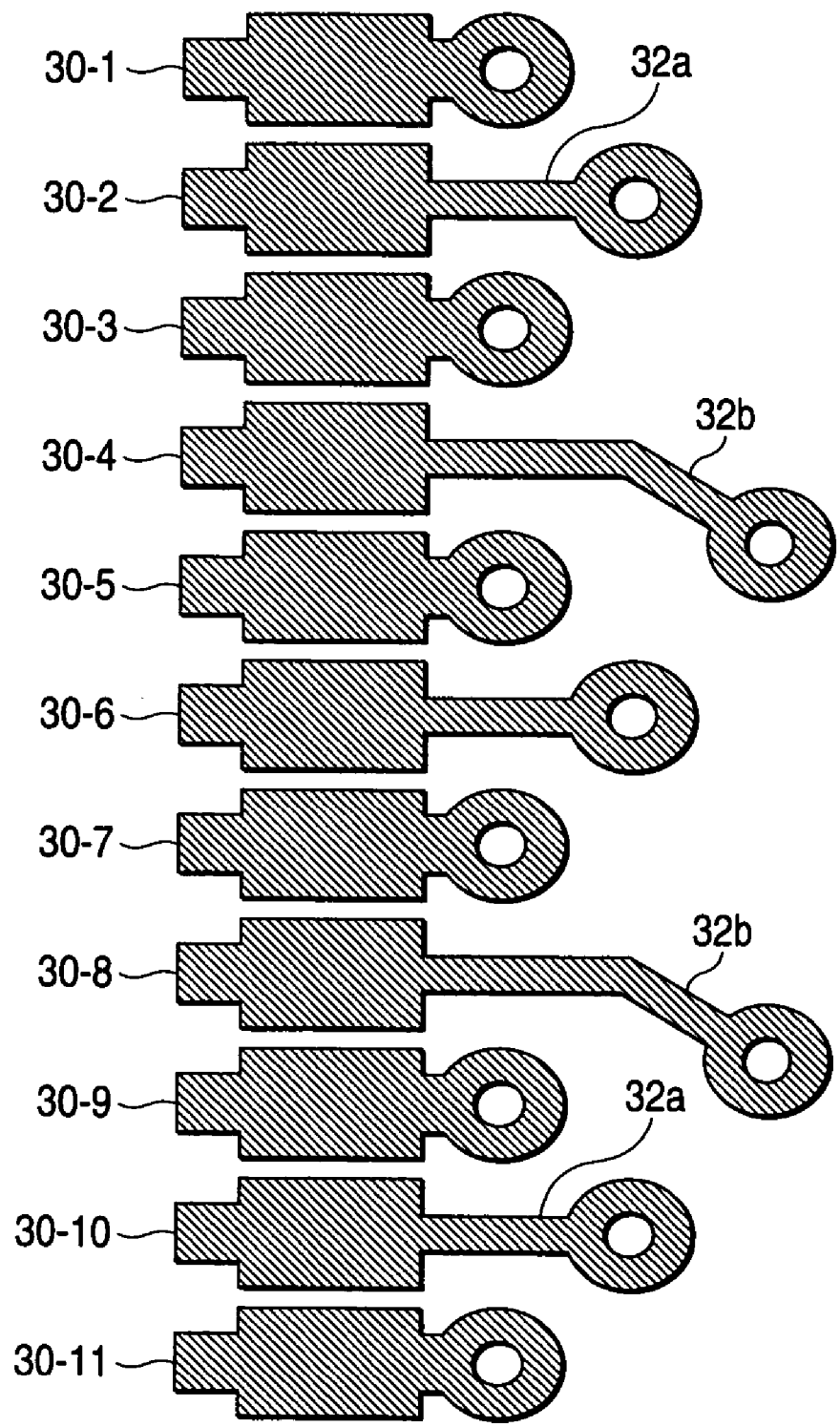
FIG. 3 is a view showing an example of arrangement of signal patterns 30.

Next, description will be made on the case where a plurality of signal patters 30 are provided in compliance with the design for a real printed-wiring board. FIG. 3 is a view showing an example of arrangement of the signal patterns 30. As described above, the surface-mounted component 200 has a plurality of signal terminals 200b. The printed-wiring board 100 is provided with the signal patterns 30 the number of which at least corresponds to the number of the signal terminals 200b.

In FIG. 3, signal patterns 30-1 to 30-11 are shown on the assumption that eleven signal patterns 30 are provided.

Some (specifically, signal patterns 30-1, 30-3, 30-5, 30-7, 30-9 and 30-11 in FIG. 3) of these signal patterns 30 have wiring portions 32 substantially as long as the wiring portion 32 shown in FIG. 2.

On the other hand, some signal patterns 30 (specifically, signal patterns 30-2, 30-6 and 30-10 in FIG. 3) have wiring portions longer than the wiring portion 32 shown in FIG. 2, and some signal patterns 30 (specifically, signal patterns 30-4 and 30-8 in FIG. 3) have wiring portions longer than the wiring portion 32 shown in FIG. 2 and inclining almost 45 degrees halfway, due to the design limitation, etc. of the printed-wiring board 100.

Figure 4:
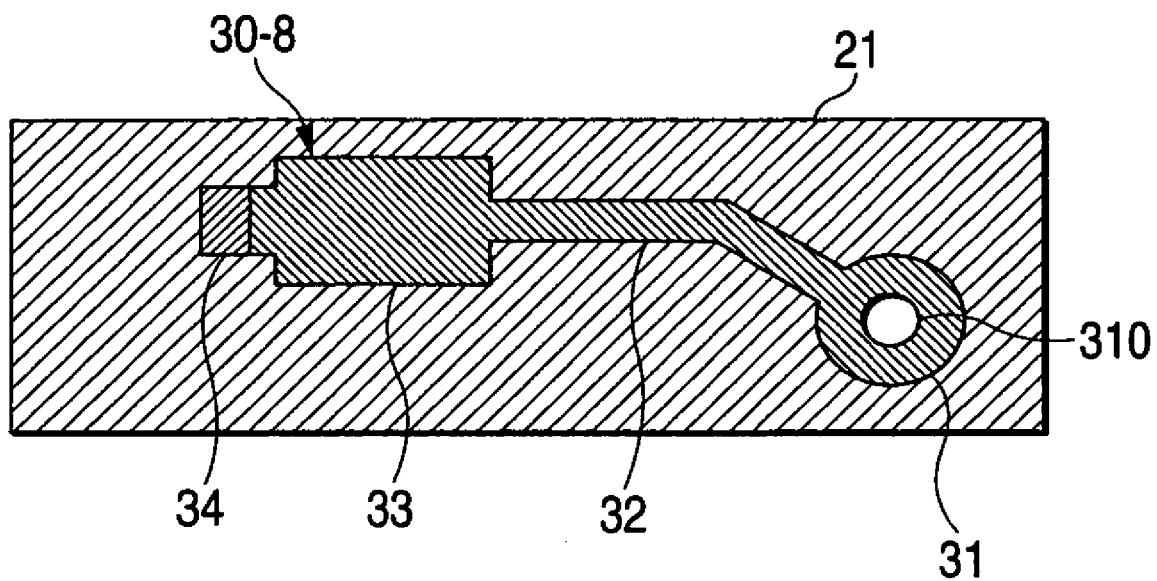
FIG. 4 is a view showing a laminated state of a solder resist in the signal pattern 30-8.

FIG. 4 is a view showing a laminated state of a solder resist in the signal pattern 30-8.

In the example shown in FIG. 3, the lengths of the reinforcing portions 34 of the signal patterns 30 are substantially equal to one another. Accordingly, as apparent from FIG. 4, the laminated state of the solder resist 21 in the signal pattern 30-8 is substantially the same as that shown in FIG. 2. Accordingly, although not shown, also in the case of the signal pattern 30-2, 30-4, 30-6 or 30-10, the region where the solder resist 21 is laminated on the reinforcing portion 34 is substantially equal to that shown in FIG. 2 or 4. Incidentally, a well-known technique such as masking may be used for preventing the solder resist 21 from being laminated on the land portion 31, the wiring portion 32 and the pad portion 33 as shown in FIG. 2 or 4.

In this manner, the effect of preventing peeling of the pad portion 33 acts on each signal pattern 30 uniformly because the lengths of the reinforcing portions 34 are made substantially equal to one another so that areas for laminating the solder resist 21 on the reinforcing portions 34 are kept substantially equal to one another in the condition that a plurality of signal patterns 30 are present and arranged into a group.

Accordingly, it is possible to prevent the pad portions 33 from being peeled when stress is applied on the printed-circuit board 1.

Incidentally, although FIG. 3 shows the case where the signal patterns 30 are arranged in one row, it is a matter of course that the arrangement form can be applied to various design forms in accordance with components to be mounted. For example, the arrangement form may be applied to the case where a plurality of signal pattern rows are formed in parallel or the case where signal patterns are arranged like a U shape. In addition, these things also apply to a modification of the first embodiment, another modification of the first embodiment, a second embodiment and a third embodiment which will be described later.

Modification of First Embodiment

Figure 5:
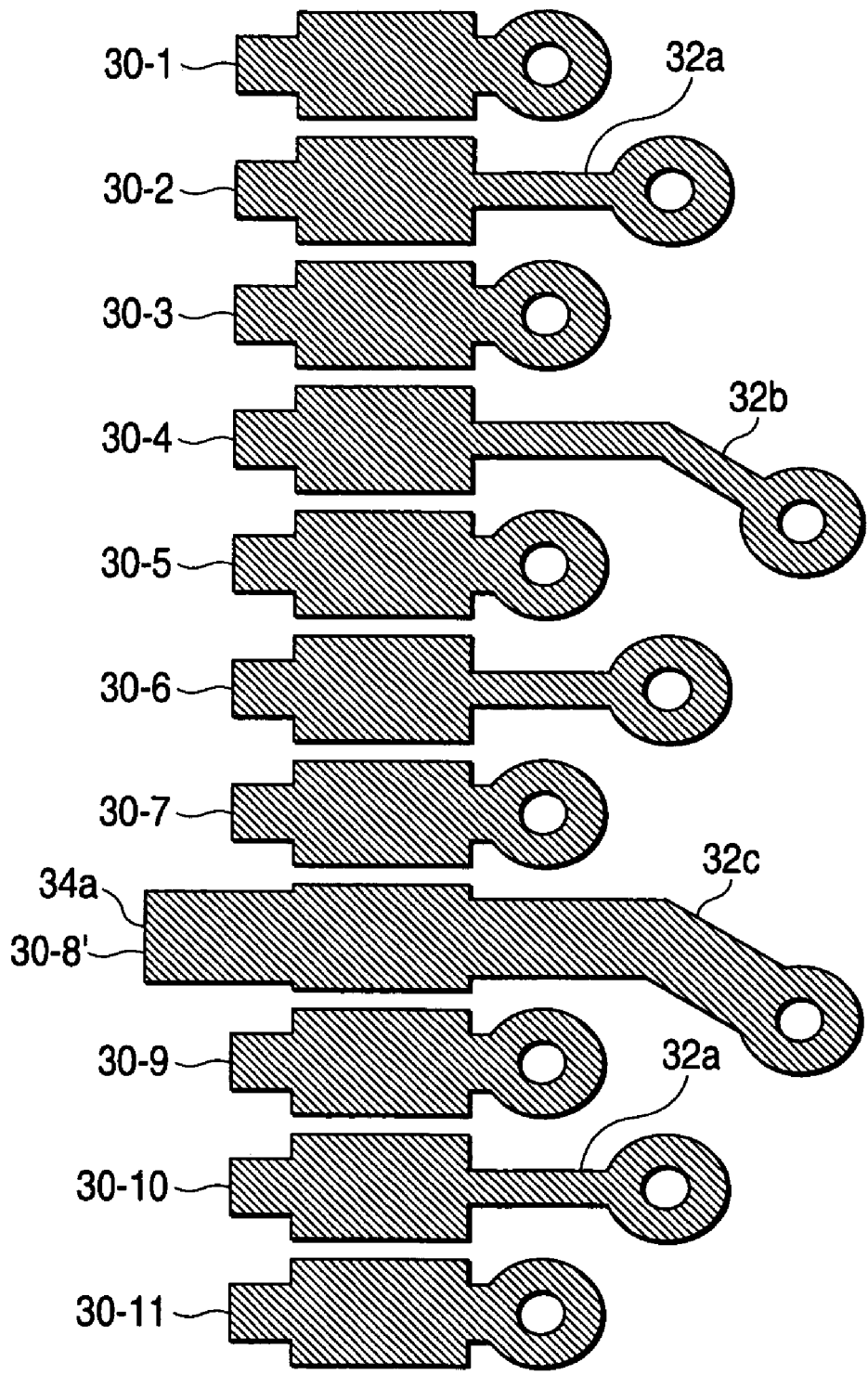
FIG. 5 is a view showing an example of arrangement of signal patterns 30 according to a modification of the first embodiment.

FIG. 5 is a view showing an example of arrangement of signal patterns 30 according to a modification of the first embodiment. If allowed on design, the reinforcing portion 34 may be formed to be wider or longer as represented by the signal pattern 30-8' shown in FIG. 5.

That is, the signal pattern 30-8' has a reinforcing portion 34a formed as if the reinforcing portion 34-8 of the signal pattern 30-8 depicted in FIG. 3 were widen and lengthened. The signal pattern 30-8' also has a wiring portion 32c formed as if the wiring portion 32b were widened.

The wiring portion 32c of the signal pattern 30-8' is a wiring portion such as a power supply or ground wiring portion necessary for wire connection to be widened in order to keep impedance as low as possible. In the case of such a wiring portion, the reinforcing portion can be formed to be wider and longer.

On the other hand, when the surface-mounted component 200 is a component such as a memory connector requiring a high-speed signal, each signal pattern 30 having a signal wiring portion other than the power supply or ground wiring portion is matched with the surface-mounted component 200 by adjusting the length of the signal pattern 30 within such a range that electrical influence such as reflection can be ignored. Accordingly, the region of the reinforcing portion 34 becomes narrower than that in the signal pattern 30-8'.

Figure 6:
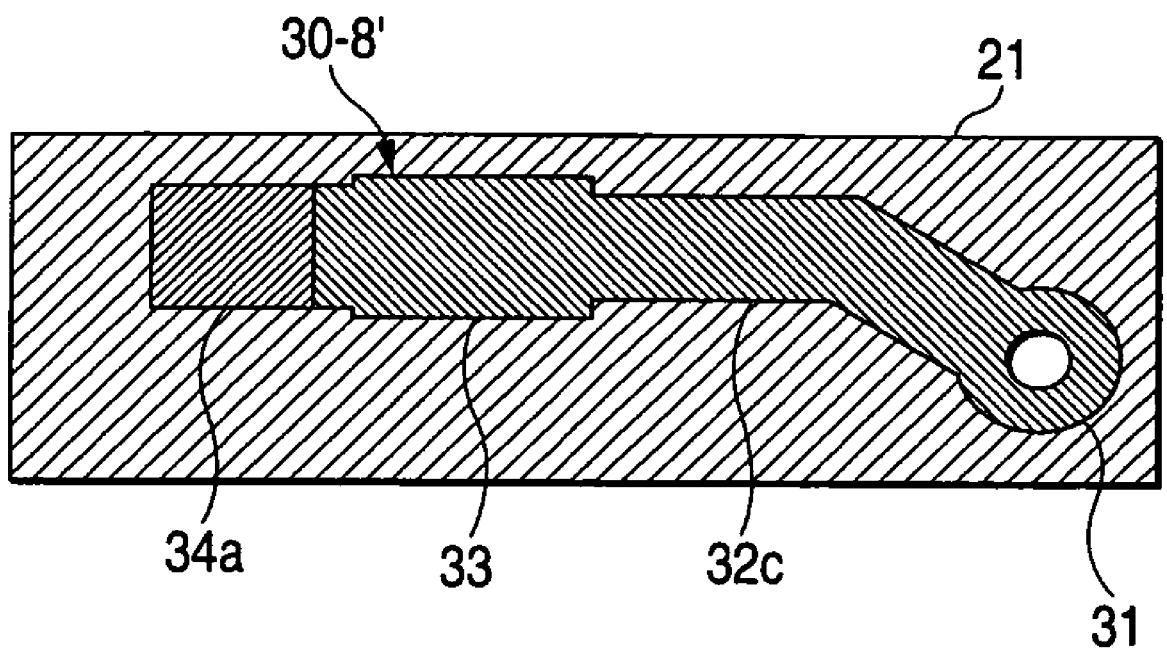
FIG. 6 is a view showing a laminated state of a solder resist in the signal pattern 30-8'.

FIG. 6 is a view showing a laminated state of a solder resist in the signal pattern 30-8'. Since the solder resist 21 is laminated on a part of the reinforcing portion 34 even in the aforementioned configuration, the pad portion 33 can be prevented from being peeled when stress is applied on the printed-circuit board 1. Particularly in this modification, the reinforcing portion 34a can prevent peeling of the pad portion 33 more effectively than any other reinforcing portion.

Accordingly, when at least one reinforcing portion 34 having a wider region is provided, the pad portion 33 of the printed-wiring board 100 corresponding to surface-mounted component 200 can be more effectively prevented from being peeled as a whole.

Another Modification of First Embodiment

Figure 7:
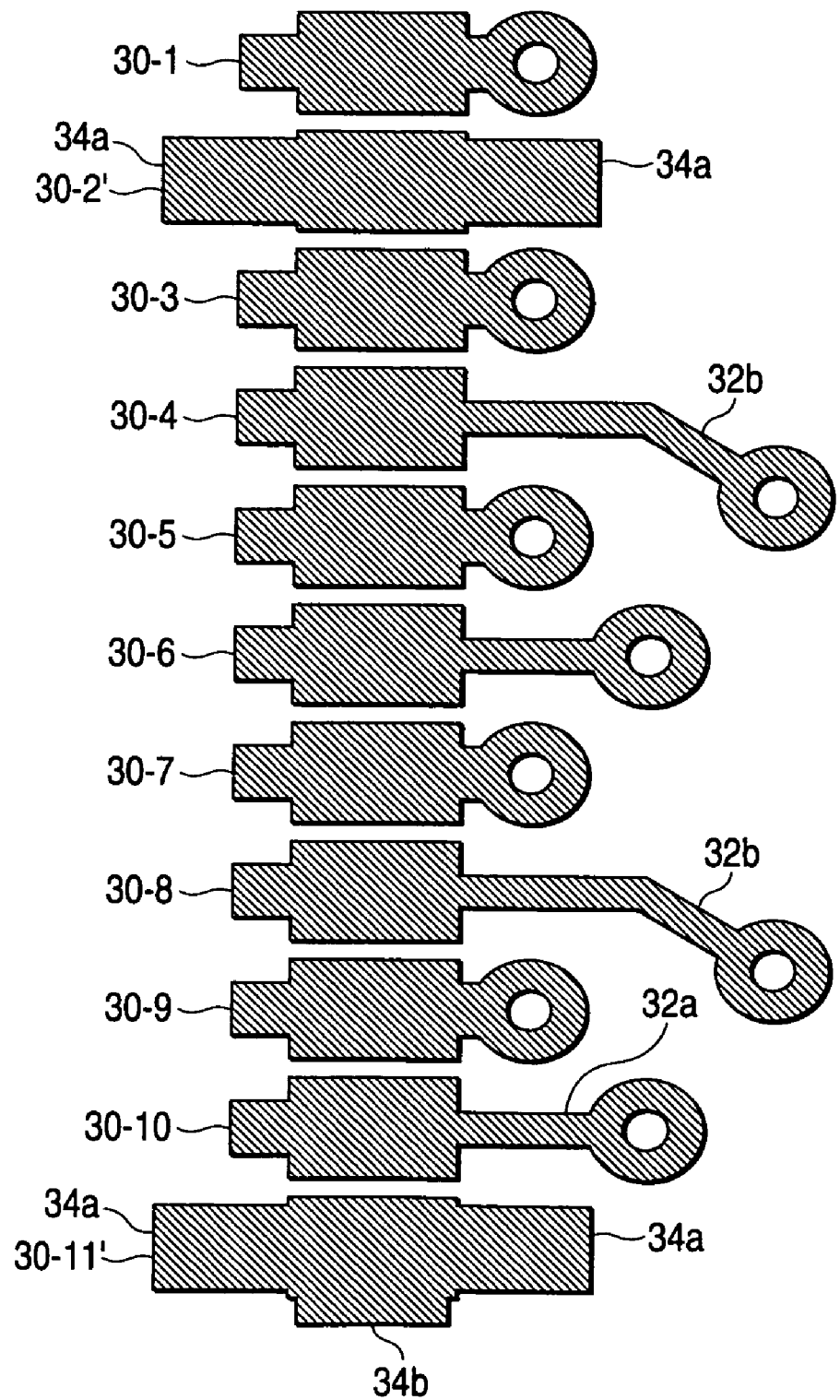
FIG. 7 is a view showing an example of arrangement of signal patterns 30 according to another modification of the first embodiment.

FIG. 7 is a view showing an example of arrangement of signal patterns 30 according to another modification of the first embodiment. If allowed on design, a plurality of reinforcing portions 34a may be provided as represented by the signal pattern 30-2' shown in FIG. 7. The reinforcing portions may be provided to extend not only in the lengthwise direction but also in the widthwise direction as represented by the reinforcing portion 34b of a signal pattern 30-11'.

The concept "allowed on design" used herein includes the case where electrical connection need not be performed for all component pads as represented by component pads for a long connector such as a Mini-PCI connector. The case where there is any so-called dummy pad not requiring electrical connection is applicable to the case of "allowed on design". To take FIG. 7 as an example, the signal patterns 30-2' and 30-11' are equivalent to signal patterns not requiring electrical connection.

Particularly since the signal pattern 30-11' is provided in the outermost portion of the arrangement of the signal patterns 30, the signal pattern 30-11' can be provided to extend not only in the lengthwise direction like the signal pattern 30-2' but also in the widthwise direction, so that the reinforcing portion 34b can be provided.

Figure 8:
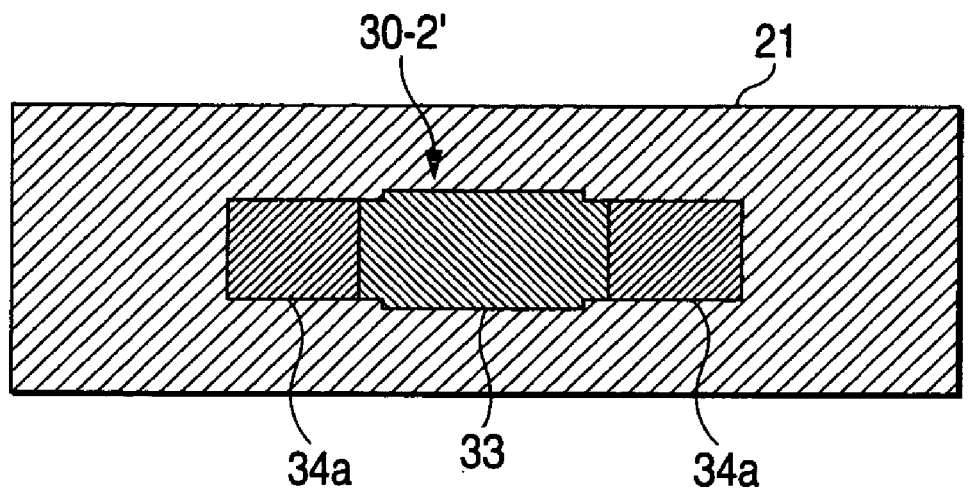
FIG. 8 is a view showing a laminated state of a solder resist in the signal pattern 30-2'.
Figure 9:
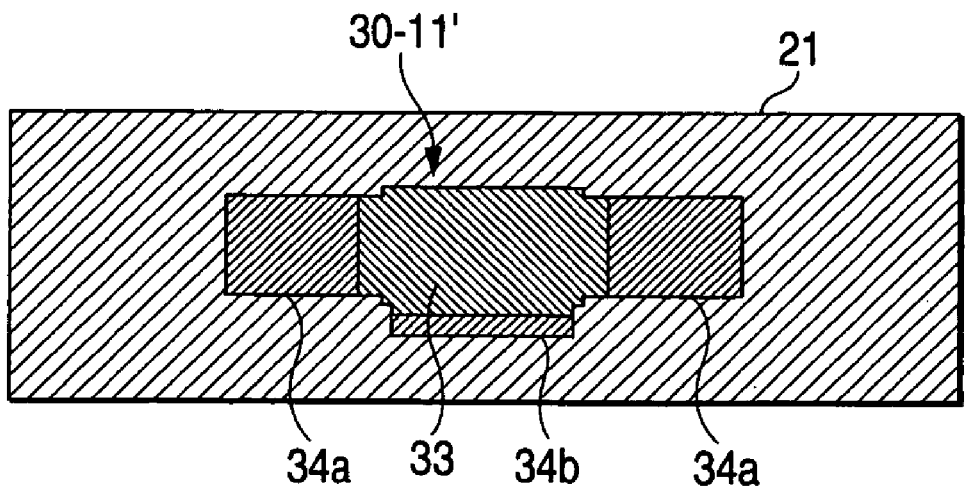
FIG. 9 is a view showing a laminated state of the solder resist in the signal pattern 30-11'.

FIG. 8 is a view showing a laminated state of the solder resist in the signal pattern 30-2'. FIG. 9 is a view showing a laminated state of the solder resist in the signal pattern 30-11'.

Since the solder resist 21 is laminated on a part of each of the reinforcing portions 34a (or 34b) even in the aforementioned configuration, the pad portion 33 can be prevented from being peeled when stress is applied on the printed-circuit board 1. Particularly in this modification, the reinforcing portions 34a can prevent peeling of the pad portion 33 more effectively than any other reinforcing portions because the reinforcing portions 34a are provided on opposite sides.

In the case of the signal pattern 30-11' in FIG. 9, the reinforcing portion 34b is further provided in the widthwise direction to thereby prevent peeling of the pad portion 33 more effectively compared with the signal pattern 30-2'.

Second Embodiment

Figure 10:
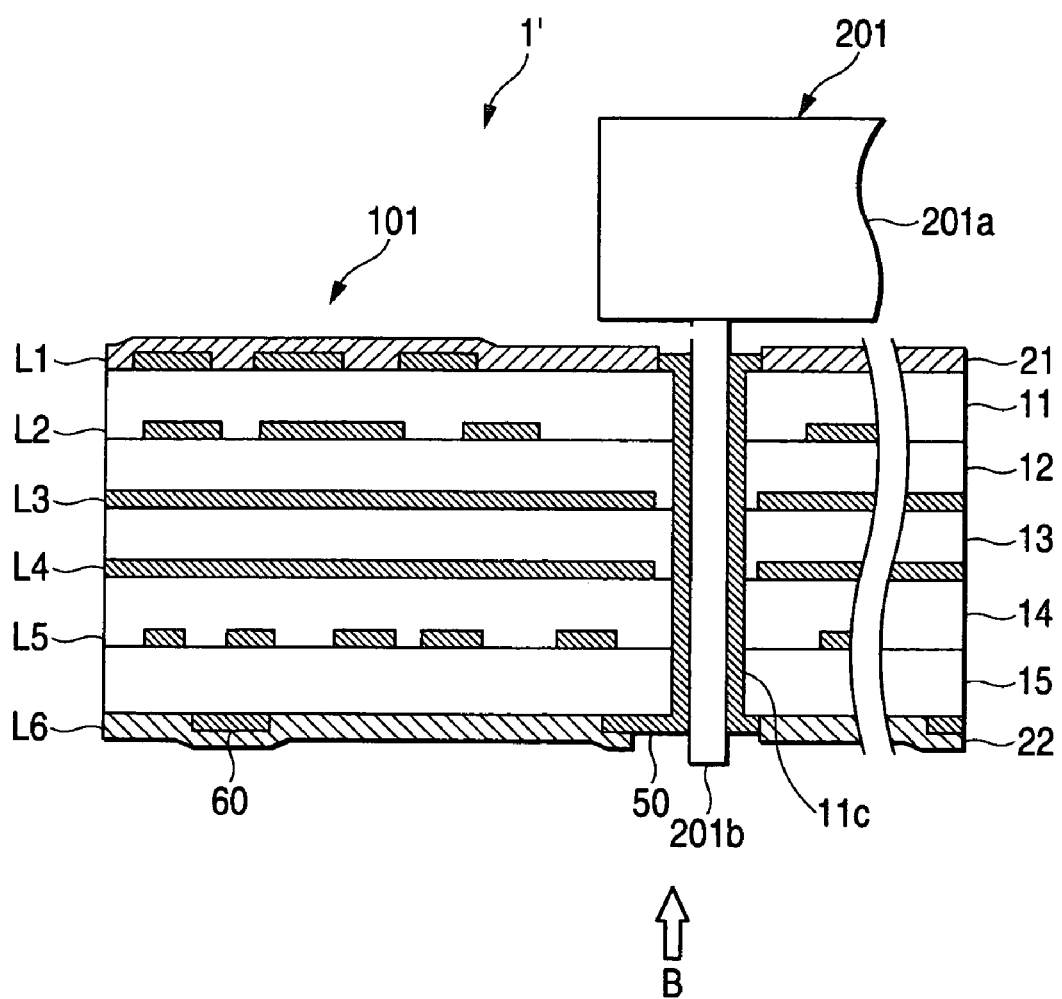
FIG. 10 is a view showing the structure of a printed-circuit board according to a second embodiment of the invention.

Next, a second embodiment according to the invention will be described with reference to FIG. 10. FIG. 10 is a view showing the structure of a printed-circuit board according to the second embodiment of the invention. In FIG. 10, parts identical to those in the printed-circuit board according to the first embodiment in FIG. 1 are referred to by the same numerals, and description thereof will be omitted here.

The point of difference between the printed-circuit board in FIG. 10 and the printed-circuit board in FIG. 1 is in that the surface-mounted component 200 is mounted on the printed-wiring board 100 in FIG. 1 whereas the printed-wiring board is changed to a printed-wiring board 101 in accordance with a DIP (Dual Inline Package) component 201 mounted thereon in this embodiment instead.

Here, the DIP component 201 is a component requiring firmer connection to the printed-wiring board than the surface-mounted component 200. The DIP component 201 is a component including a body 201a, and a plurality of signal terminals 201b to penetrate the printed-wiring board 101. The DIP component 201 is an insertion type connector such as an LAN connector.

The printed-wiring board 101 is provided with through-holes 11c which are holes passing through the printed-wiring board 101 from the first layer (L1) to the sixth layer (L6). The terminals 201b are inserted into the through-holes 11c and fixed to the through-holes 11c by soldering (not shown). Incidentally, the inner layers of the through-holes 11c are plated with conductors respectively to thereby form a circuit for connecting the first layer (L1) and the sixth layer (L6) to each other.

In the signal layer which is the sixth layer (L6) in FIG. 10, signal patterns 50 and 60 are formed. As will be described later, the signal patterns 50 are provided to correspond to at least the number of the signal terminals 201b in the DIP component 201.

Figure 11A:
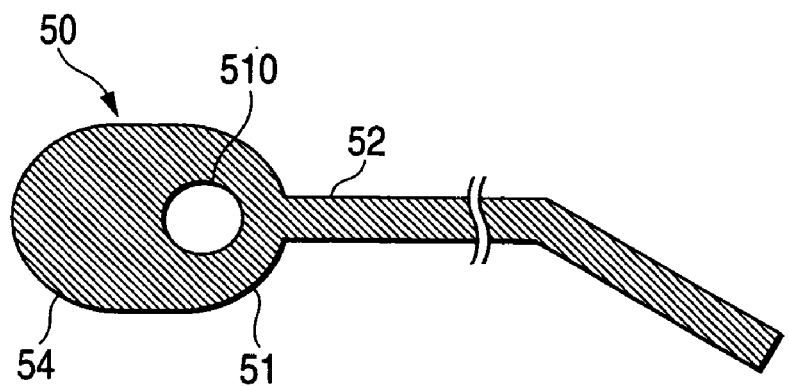
FIGS. 11A and 11B are views from a direction B, of the periphery of a signal pattern 50 of a printed-wiring board 101 depicted in FIG. 10.
Figure 11B:
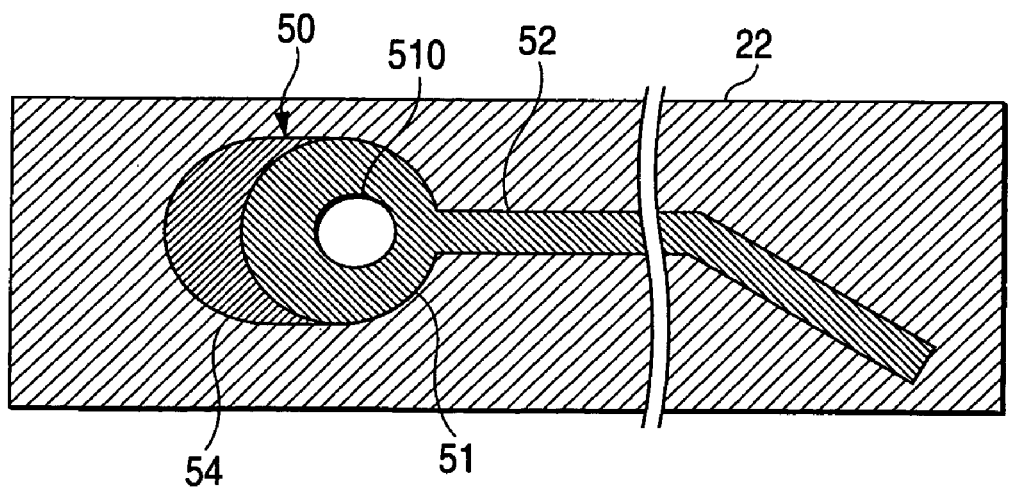

Next, the structure of a signal pattern 50 will be described with reference to FIGS. 10, 11A and 11B. FIGS. 11A and 11B are views from a direction B, of the periphery of the signal pattern 50 in the printed-wiring board 101 depicted in FIG. 10. Only a signal pattern 50 is shown in FIG. 11A whereas a solder resist 22 as well as the signal pattern is shown in FIG. 11B.

Although a plurality of signal patterns 50 are provided as described above, only one of them is shown in FIGS. 11A and 11B for the sake of simplification.

As shown in FIGS. 11A and 11B, the signal pattern 50 has a land portion 51, a reinforcing portion 54, and a wiring portion 52.

Here, the land portion 51 is made of a circular conductor having a hole portion 510 for electrically connecting the first layer (L1) and the sixth layer (L6) to each other via the through-hole 11c (see FIG. 10).

The reinforcing portion 54 is made of a conductor provided to extend from the land portion 51. The reinforcing portion 54 plays a role of preventing peeling of the land portion 51. That is, configuration is made so that the aforementioned solder resist 22 is laminated on at least a part of the reinforcing portion 54.

Accordingly, as shown in FIGS. 11A and 11B, the solder resist 22 has an opening portion for exposing the land portion 51, the wiring portion 52 and a part of the reinforcing portion 54 (if necessary). Alternatively, configuration may be made so that the solder resist 22 has an opening portion for exposing at least the land portion 51 since the land portion 51 is used for performing electrical connection to the DIP component 201.

Although the reinforcing portion 54 shown in FIGS. 11A and 11B is substantially shaped like an ellipse as a whole in such a manner that the land portion 51 is extended directly without change of the width, the invention is not limited thereto. For example, the reinforcing portion 54 may be provided to extend from the land portion 51 but with a smaller width than that of the land portion 51 or with a larger width than that of the land portion 51. If allowed on design, the reinforcing portion 54 may be provided to extend from the land portion 51 not in one direction but in a plurality of directions. Accordingly, when the reinforcing portion 54 is provided to extend from the land portion 51 in all directions, the reinforcing portion 54 may be shaped like a circle larger than the circle of the land portion.

In this manner, the land portion 51 can be prevented from being peeled since the solder resist 22 is laminated on the reinforcing portion 54 formed in a place other than the land portion 51 which is a region for performing electrical connection to the signal terminal 201b. That is, in the case of a DIP component 201 such as an LAN connector, an LAN cable or the like is inserted/removed into/from the DIP component 201 frequently. On this occasion, excessive stress is applied on the DIP component 201, so that the stress is transmitted to the printed-wiring board 101 through the terminal 201*b*.

When the stress applied on the printed-wiring board 101 is bending stress, maximum tensile (or compressive) stress is applied on the outermost layer of the printed-wiring board 101. In addition, when the stress applied on the printed-wiring board 101 is normal stress, force may act on the signal pattern 50 to pull up the signal pattern 50 directly. Accordingly, the stress applied on the DIP component 201 is a direct cause of peeling of the land portion 51 of the signal pattern 50. Accordingly, when configuration is made so that the solder resist 22 is laminated on a part of the reinforcing portion 54 provided to extend from the land portion 51 as described above, peeling of the land portion 51 can be prevented finally because the reinforcing portion 54 suppresses the peeling force even if stress is applied on the printed-circuit board 1'.

Third Embodiment

Figure 12:
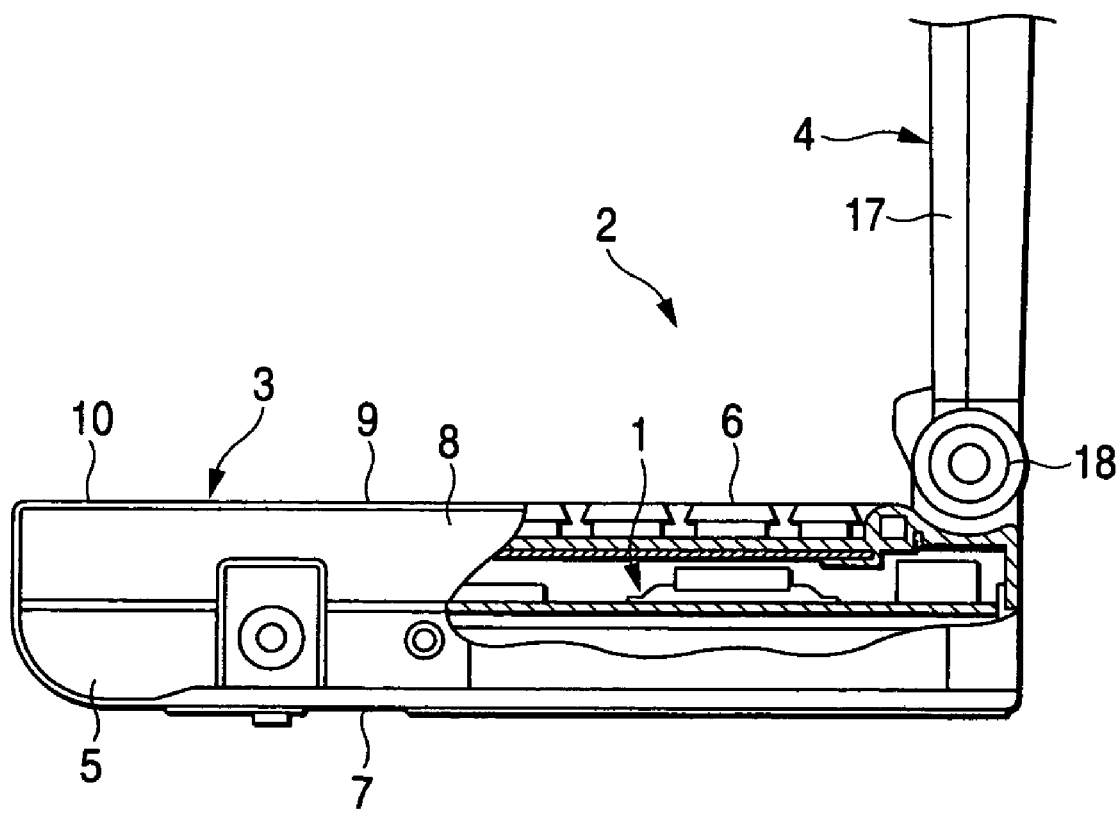
FIG. 12 is a view showing an electronic apparatus according to an embodiment of the invention.

Next, an electronic apparatus according to an embodiment of the invention will be described with reference to FIG. 12. FIG. 12 is a view showing the electronic apparatus according to the embodiment of the invention. The electronic apparatus according to this embodiment includes the printed-circuit board 1 according to the first embodiment or the printed-circuit board 1' according to the second embodiment.

FIG. 12 shows the case where the aforementioned printed-circuit board 1 is used in a book type personal computer 2.

The book type personal computer 2 shown in FIG. 12 includes a computer body 3, and a display unit 4 supported by the computer body 3. The computer body 3 has a housing 5 forming the contour of the computer body 3, a keyboard 6 provided in an upper surface of the housing 5 and serving as means for inputting information, etc.

The housing 5 is shaped like a flat box having a bottom wall 7, a side wall 8, and a top wall 9. The side wall 8 extends upward from the circumference of the bottom wall 7. The top wall 9 is connected to an upper end of the side wall 8 and opposite to the bottom wall 7. The front portion of the top wall 9 is formed as a flat palm rest 10. The keyboard 6 is disposed in the rear of the palm rest 10.

The display unit 4 has a display housing 17 in which a liquid crystal display device (not shown) is stored. The display housing 17 is supported in the rear end portion of the housing 5 so as to be rotatable around a hinge shaft 18. With this configuration, the display unit 4 can rotate between a close position and an open position. In the close position, the display unit 4 is pushed down to cover the palm rest 10 and the keyboard 6. In the open position, the display unit 4 is pulled up to expose the palm rest 10 and the keyboard 6.

Packed devices (not shown) such as a CD-ROM drive device and a hard disk drive device and the aforementioned printed-circuit board 1 electrically connected to the packed devices are stored in the inside of the housing 5. It is a matter of course that the printed-circuit board 1 may be replaced by the printed-circuit board 1'.

Also in the aforementioned electronic apparatus, peeling of the pad portions 33 (or the land portions 51) can be prevented when stress is applied on the printed-circuit board 1 (or the printed-circuit board 1') since the solder resist 21 (or solder resist 22) is laminated on a part of each of the reinforcing portions 34 (or the reinforcing portions 54).

What is claimed is:

1. A printed-wiring board having a multilayer structure including a plurality of insulating layers and a plurality of conducting layers, comprising:
    a signal pattern provided in at least one of outermost layers of the conducting layers, the signal pattern including:
    a plurality of pad portions which are provided in positions opposite to a plurality of signal terminals of a connector component arranged in a predetermined form and perform electrical connection;
    reinforcing portions which are provided to extend from the pad portions respectively in a lengthwise direction; and
    land portions to perform the electrical connection to another layer of the conducting layers; and
    a solder resist provided on the outermost layer of the conducting layers to cover the reinforcing portion and having an opening portion to expose at least the pad portion.

2. The printed-wiring board according to claim 1, wherein the reinforcing portion has a width smaller than a width of the pad portion.

3. The printed-wiring board according to claim 1, wherein the pad portions provided opposite to the signal terminals are arranged in at least one straight line.

4. The printed-wiring board according to claim 3, wherein at least one of the reinforcing portions provided to extend from the pad portions has a width larger than a width of another reinforcing portion.

5. The printed-wiring board according to claim 3, wherein at least one of the reinforcing portions provided to extend from the pad portions has a length larger than a length of another reinforcing portion.

6. The printed-wiring board according to claim 3, wherein
    one of the signal patterns including the arranged pad portions, which does not require the electrical connection to the connector component, has another reinforcing portion which is provided in place of the land portion and extends from the pad portion in the lengthwise direction on an opposite side to the reinforcing portion, and
    the solder resist is provided to cover the reinforcing portion and the another reinforcing portion and has an opening portion to expose the pad portion.

7. A printed-wiring board having a multilayer structure including a plurality of insulating layers and a plurality of conducting layers, comprising:
    through-holes which are provided respectively in positions opposite to a plurality of signal terminals of a DIP (Dual Inline Package) component to be mounted, penetrate the printed-wiring board and have inner walls plated with conductors;
    a signal pattern provided in an outermost layer of the conducting layers on an opposite side to a side where the DIP component is mounted, the signal pattern including:
    land portions electrically connected to the through-holes; and
    reinforcing portions which are provided to extend from the land portions respectively in a predetermined direction; and
    a solder resist provided on the outermost layer of the conducting layers to cover the reinforcing portions and having an opening portion to expose the land portion.

8. An electronic apparatus comprising:
a housing having a unit to input information; and
a printed-circuit board stored inside the housing,
wherein
the printed-circuit board includes:
- a connector component having a plurality of signal terminals arranged in a predetermined form; and
- a printed-wiring board form from a plurality of insulating layers and a plurality of conducting layers, and the printed-wiring board includes:
- a signal pattern provided in at least one of outermost layers of the conducting layers, the signal pattern including:
  - a plurality of pad portions which are provided in positions opposite to a plurality of signal terminals of a connector component and perform electrical connection;
  - reinforcing portions which are provided to extend from the pad portions respectively in a lengthwise direction; and
  - land portions to perform the electrical connection to another layer of the conducting layers; and
- a solder resist provided on the outermost layer of the conducting layers to cover the reinforcing portion and having an opening portion to expose the pad portion.

9. The printed-wiring board according to claim 1, wherein the insulating layers and the conducting layers are laminated alternately.

10. The printed-wiring board according to claim 1, wherein the opening portion of the solder resist exposes at least the pad portion and the land portion.

11. The printed-wiring board according to claim 1, wherein the land portions include hole portions that perform the electrical connection to another layer of the conducting layers.

12. The printed-wiring board according to claim 1, wherein the signal pattern further includes wiring portions that electrically connect the land portions and the pad portions.

* * * * *